United States Patent [19]

Pfleiderer

[11] 4,182,965

[45] Jan. 8, 1980

[54] SEMICONDUCTOR DEVICE HAVING TWO INTERSECTING SUB-DIODES AND TRANSISTOR-LIKE PROPERTIES

[75] Inventor: Hans Pfleiderer, Munich, Fed. Rep. of Germany

[73] Assignee: Siemens Aktiengesellschaft, Berlin & Munich, Fed. Rep. of Germany

[21] Appl. No.: 825,148

[22] Filed: Aug. 16, 1977

[30] Foreign Application Priority Data

Aug. 17, 1976 [DE] Fed. Rep. of Germany ....... 2636873

[51] Int. Cl.² ............................................. H01L 27/12
[52] U.S. Cl. .................................. 307/299 R; 357/21; 357/23; 357/27; 357/33; 357/34; 357/57; 357/58
[58] Field of Search ....................... 357/58, 57, 21, 27, 357/23, 33; 307/299 R, 301

[56] References Cited

U.S. PATENT DOCUMENTS

| | | | |
|---|---|---|---|
| 3,324,297 | 6/1967 | Stieltjes et al. ........................ | 357/58 |
| 3,686,684 | 8/1972 | Matsushita et al. ................... | 357/58 |
| 3,710,206 | 1/1973 | Matsushita .............................. | 357/22 |
| 3,731,123 | 5/1973 | Matsushita .............................. | 357/59 |
| 3,840,888 | 10/1974 | Gaensslen et al. ..................... | 357/58 |

*Primary Examiner*—William D. Larkins
*Attorney, Agent, or Firm*—Hill, Van Santen, Steadman, Chiara & Simpson

[57] ABSTRACT

A semiconductor device is disclosed in which an intrinsic or weakly doped semiconductor layer is arranged on a substrate. The semiconductor layer contains a first P doped zone and a first N doped zone which are separated by a portion of the said intrinsic layer serving as base zone. The semiconductor layer further contains a second P doped zone and a second N doped zone which are also separated from one another by the base zone. The four doped zones are arranged such that a connecting line between the second P doped zone and second N doped zone intersects a connecting line between the first P doped zone and the first N doped zone preferably at right angles. A sub-diode formed of the first doped zones affects the operation of a sub-diode formed by the second doped zones.

14 Claims, 4 Drawing Figures

SEMICONDUCTOR DEVICE HAVING TWO INTERSECTING SUB-DIODES AND TRANSISTOR-LIKE PROPERTIES

BACKGROUND OF THE INVENTION

The invention relates to a semiconductor device having an intrinsic or weakly doped semiconductor layer containing a P doped zone and a N doped zone separated by an intrinsic or weakly doped base zone.

Bipolar transistors and field effect transistors are known semiconductor devices. In semiconductor thin-film technology, bipolar transistors can be constructed as so-called "lateral transistors". In this technology it is difficult to produce sufficiently short base zones.

SUMMARY OF THE INVENTION

An object of the invention is to provide a bipolar semiconductor device or component having transistor-like properties, which is suitable for construction in thin-film technology.

According to the invention, a semiconductor device is formed of an insulating or weakly conductive substrate with an intrinsic or weakly doped semiconductor layer arranged on the substrate. First and second P doped zones and first and second N doped zones are formed in this semiconductor layer. Each of the zones is separated from the others by a portion of the semiconductor layer which serves as an intrinsic or weakly doped base zone. A connecting line between the second P doped zone and the second N doped zone intersects a connecting line between the first P doped zone and the first N doped zone. The first P and N doped zones form a first sub-diode and the second P and N doped zones form a second sub-diode. The operation of one sub-diode affects the operation of the other sub-diode.

DESCRIPTION OF THE PREFERRED EMBODIMENTS

The invention is based on the following considerations: bipolar semiconductor components consist of a sequence of semiconductor layers exhibiting differing doping. Layer sequences of this type can easily be achieved in semiconductor wafers by diffusing in dopant from both surfaces. In the Planar technique, only one surface side of a semiconductor wafer, e.g. a silicon wafer, is processed. Thus, for example, there are both laterally constructed transistors and PIN diodes in the Planar technique. Structures of this type are particularly suitable for the thin-film technique. A lateral structuring can be two-dimensional, e.g. in accordance with FIG. 1, where 1 designates a substrate, in particular an insulating substrate, 2 designates a layer of semiconductor material, 3 designates a first P doped zone; 4 designates a second P doped zone, 10 designates an intrinsic or weakly doped base zone, 6 designates a first N doped zone and 5 designates a second N doped zone. On the doped zones 3, 4, 5, 6 metal layers 13, 14, 15, 16 are applied as ohmic contacts and are provided with supply lines. The construction illustrated therein can be considered as a construction of two side-by-side diodes, or as has been done below, as a pair of intersecting diodes, depending upon the manner in which the terminals are applied and connected. The pairs of zones 3, 6 and 4,5 are considered as sub-diodes. The base path between the two doped zones can be shorter than, equal to, or exceed the diffusion length of the charge carriers. When the distance between the P zone and the N zone of a sub-diode is great in comparison to the diffusion length of the charge carriers in the base zone 10 lying therebetween, such a sub-diode will be referred to as a "long" diode, and otherwise as a "short" diode. The electrical current flow through the intrinsic or weakly doped base zone 10 takes place by diffusion of the charge carriers in the case of "short" diodes poled in the forward direction, and takes place by a drift movement of charge carriers injected to the P or N conducting zones in the case of "long" diodes. The system consisting of the two intersecting PIN diodes or PSN diodes can consist of two "short" and also of two "long" diodes or a combination of a "long" and a "short" sub-diode. The significance of the four-pole structure is that the characteristics of the sub-diodes mutually influence one another.

Figure 2:
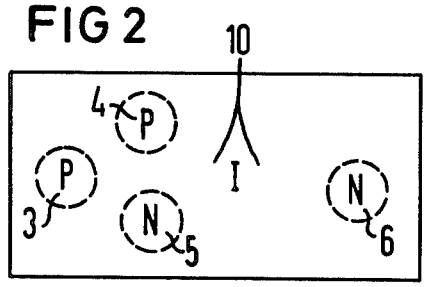
FIGS. 2 and 3 are plan views of the arrangement of P type, intrinsic or weakly doped, and N type zones for various embodiments of the invention.
Figure 3:
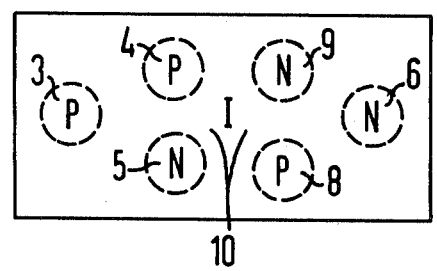

In a special embodiment of the invention, a "long" diode is combined with one (FIG. 2) or a plurality of e.g. two "short" diodes (FIG. 3). The asymmetrical form shown in FIG. 2 is used in particular when the intermediate area between the doped zones which represents the base zone 10 is not intrinsic but is weakly doped. With the described arrangement of the intersecting diodes, the currents flowing through the two diodes mutually influence one another. When one "long" diode is combined with a plurality of e.g. two "short" or also "long" diodes, a structure is obtained which has a plurality of inputs (4, 5 and 8,) (FIG. 3). A further generalization of the diode intersection leads to a star-like arrangement of diodes which mutually penetrate one another.

In the following the mode of functioning of the component corresponding to the invention will be explained in detail.

First, a special mode of functioning of the component corresponding to the invention comprising two sub-diodes will be explained. A sub-diode to which a voltage $U_1$ is connected and through which the current $I_1$ flows is referred to as an input diode. The other diode which is connected to the voltage $U_2$ and through which the current $I_2$ flows is considered as an output diode. The two currents $I_1$ and $I_2$ are dependent upon the two voltages $U_1$, $U_2$. We have:

$$I_1 = G_{11}U_1 + G_{12}U_2,$$

$$I_2 = G_{21}U_1 + G_{22}U_2$$

or in brief $$I = G \cdot U$$

where $G_{11}$, $G_{12}$, $G_{21}$, $G_{22}$ are the elements of a matrix G; these are functions of the two voltages $U_1$, $U_2$ resulting for $U_1 \to 0$ in $G_{11}U_1 \to 0$ and $G_{21}U_1 \to 0$ and with corresponding results when $U_2 \to 0$. Currents and voltages in the forward direction (forward currents and voltages) are marked with a positive sign, whereas backward (reverse) currents and voltages are marked with a negative sign. Now the situation $$U_1 > 0, \quad U_2 < 0 \qquad \text{(Equation 1)}$$

will be considered. The input will thus be considered to be poled in the forward direction, whereas the output will be considered to be poled in the backward direction. The input voltage $U_1 > 0$ amplifies the output reverse current $I_2$, which on account of $U_2 < 0$, is $I_2 < 0$. Likewise the output voltage $U_2 < 0$ increases the input current $I_1$ which, on account of $U_1 > 0$, is $I_1 > 0$. Accordingly, $G_{12} < 0$ and $G_{21} < 0$. It is to be assumed that these two effects maintain a balance. Thus $$G_{21} U_1 + G_{12} U_2 = 0 \qquad \text{(Equation 2)}$$

Now, with a fixed input voltage $U_1$, the currents $I_1$ and $I_2$ for $U_2 \neq 0$ and $U_2 = 0$ are compared with one another. Thus it is necessary to distinguish $G(U_2)$ from $G(0)$. Furthermore $G_{11}(0) \approx G_{11}(U_2)$ is set, and $I_2(U_2=0) = G_{21}(U_2=0) \cdot U_1 \approx 0$ and $G_{22}(U_2)U_2 \approx 0$. Then from Equation 2 the equation $$I_1(U_2) - I_1(U_2=0) + I_2(U_2) = 0 \qquad \text{(Equation 3)}$$

can be approximately obtained, where $I_1(U_2=0)$ is determined by $U_1$.

The output reverse current $I_2$ is fundamentally transferred from the input current $I_1$. In order to illustrate Equation 3, the current transfer coefficient $$\alpha = \frac{|I_2(U_2)|}{I_1(U_2)} = 1 - \frac{I_1(U_2 = 0)}{I_1(U_2)} \qquad \text{(Equation 4)}$$

and the current amplification coefficent $$\beta = \frac{|I_2(U_2)|}{I_1(U_2 = 0)} = \frac{I_1(U_2)}{I_1(U_2 = 0)} - 1 \qquad \text{(Equation 5)}$$

are introduced.

A comparison of Equation 4 and Equation 5 indicates that $$\beta = \frac{\alpha}{1 - \alpha}, \quad \alpha = \frac{\beta}{1 + \beta}$$

Furthermore, since $|I_2(U_2)| < I_1(U_2)$, it follows that: $0 \leq \alpha \leq 1$ and $0 \leq \beta \leq \alpha$.

With a full current transfer of $\alpha = 1$, the current amplification is $\beta = \alpha$. With an absent current transfer $\alpha = 0$, the curent amplification also disappears, i.e., $\beta = 0$. For $\alpha = \frac{1}{2}$, $\beta = 1$, i.e. $\alpha > \frac{1}{2}$ supplies $\beta > 1$. A current amplification results in a power amplification when $|U_2| > U_1$ is chosen.

In order to underline the similarity of the component corresponding to the invention with a bipolar transistor, in the following the input diode will also be referred to as an emitter diode and the output diode will also be referred to as a collector diode. The interaction between input and output takes place in that the holes and electrons injected via the emitter diode of the input are partially sucked away by the collector diode of the output. To enable a reasonable current response to take place, the injection must be effected directly into the space charge zone of the collector diode. In the ideal situation of an intrinsic base, the space charge zone would extend from the anode of the collector diode to the cathode. With a doped base, the voltage applied to the collector diode must be sufficient for the space charge zone commencing from a contact to reach the connection line between anode and cathode of the emitter diode, the "emitter axis". An asymmetrical structure as illustrated in FIG. 2 meets this requirement.

Figure 1:
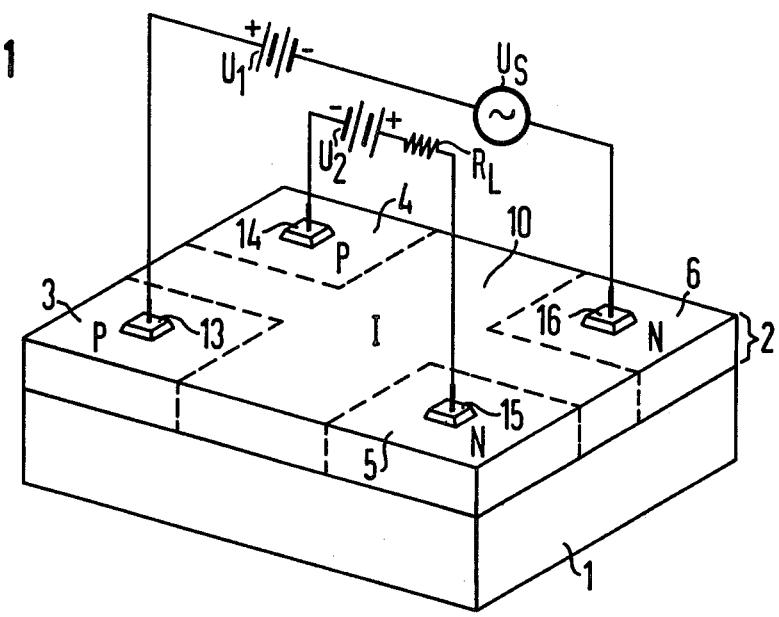
FIG. 1 schematically illustrates the construction of a semiconductor component corresponding to the invention.

As shown in FIG. 1, the input circuit may include the forward bias $U_1$ connected in series with a control voltage $U_s$ between terminals 13 and 16. The output circuit is a series connection of a reverse bias $U_2$ and load $R_1$ connected between terminals 14 and 15.

In order to estimate the degree of current amplification, it is provided that $\beta = t_1/t_2$, where $t_1$ signifies a minority carrier transit time between the emitter contacts (needed to cross the base region common with the collector diode) and $t_2$ signifies the corresponding time for the collector contacts. A more precise estimation can be given for an arrangement consisting of two "long" diodes in the form $$\beta = \frac{|U_2|}{U_1}; \quad \alpha = \frac{1}{1 + U_1/|U_2|}.$$

Then the situation $\beta > 1$ can easily be attained. Consequently, with an increasing reverse voltage, there is not only an increase in the current amplification but also a decrease in the switching time.

In pulsed operation, the switching speed essentially corresponds to the time required to transfer the injected charge carriers. The dimensions of the base zone 10 are related to the diffusion length of the charge carriers and thus, in particular, to the carrier lifetime. Thus when the charge carriers have a low lifetime, correspondingly small dimension have to be chosen for the base zone 10 which has a favorable effect upon the switching speed.

When the component corresponding to the invention is constructed in the SOS technology (silicon on sapphire), a distance of 10 μm is already "long" i.e., considerably longer than the diffusion length of the charge carriers. Therefore, by designing the component corresponding to the invention in the SOS technology, very short switching times can be achieved. In SOS technology, the production of good lateral transistors is difficult since the requisite short base length of approximately 1 μm cannot easily be preserved because of lateral diffusion. The component corresponding to the invention on the other hand has advantages because it is indeed capable of functioning in the case of comparatively larger base diameters.

Figure 4:
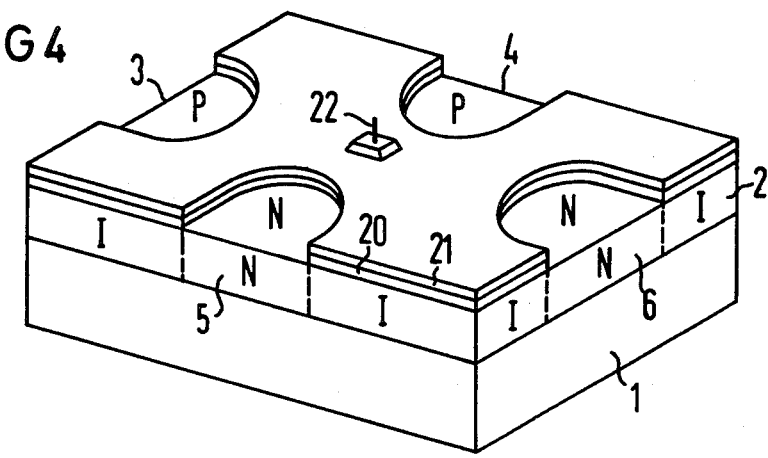
FIG. 4 illustrates a component, provided with a field effect electrode, corresponding to the invention.

In the device corresponding to the invention, an additional field effect control of the potential distribution and of the space charge distribution and the carrier concentration distribution can be carried out which affects the current distribution and the current transfer. For this purpose, as shown in FIG. 4, a field effect electrode 21 is applied over an insulating layer 20. The field effect voltage can be applied between the terminal 22 and a (not shown) substrate contact, or also between 22 and one of the base contacts 3, 4, 5 or 6.

Another additional control possibility consists in connecting a magnetic field in parallel to the surface, so that the Lorentz force is at right angles to the surface. In this way, for example, the current between the contacts of an emitter diode can be brought deeper into the base volume so that the current transfer into the collector circuit reduces.

The arrangement corresponding to the invention has here been represented as an input diode and an output diode which intersect with one another. In addition, simpler connection possibilities with conventional modes of functioning are possible. The interconnection of the two P contacts and the two N contacts produces a PSN diode. Naturally, one sub-diode will also be sufficient. In the case of a long base, a double injection diode is obtained. The application of a transversal magnetic field in parallel with the layer produces a magnetodiode. If, for example, a deeper semiconductor base exists, the injection current can be drawn downwards by the Lorentz force. The increase in the length of the current path then produces an increase of the resistance. In the case of a thin-film base, as occurs, for example, when the SOS technology is employed, a lifetime gradient extends into the semiconductor from the substrate surface towards the surface of the semiconductor layer. The Lorentz force can deflect the carriers either towards the substrate surface or towards the surface of the semiconductor layer. In the first situation the average lifetime is shorter than in the second situation. Therefore the double injection is impeded in the first situation but promoted in the second situation. In dependence upon the direction of the magnetic field, an extremely powerful positive or negative magnetoresistance is obtained.

If, in an arrangement corresponding to the invention comprising a "long" and "short" diode (e.g. as in FIG. 2), a terminal of the short transverse diode is left open, a structure is obtained for example, where $\pi$ is a longitudinal base with injecting contacts at the opposite ends. A $\pi$N junction is arranged transversely thereto. This arrangement can be understood and operated as a double-base diode. In diodes of this type, the base can be provided with ohmic contacts in the longitudinal direction, but also, as here, with injecting contacts. The characteristics react sensitively to an external magnetic field which, however, must now be applied perpendicular to the layer. The component is then referred to as a double-base magnetiodiode.

An arrangement corresponding to the invention composed of two "short" sub-diodes can be understood and operated as a bipolar lateral transistor whose base terminal is divided in two.

An arrangement corresponding to the invention comprising a field effect electrode similar to the structure shown in FIG. 4 can be considered and operated as a pair of complementary field effect transistors having a common gate. If one transistor is opened by a field effect, the other becomes blocked and vice versa.

An arrangement corresponding to the invention with a field effect electrode, poled in the reverse direction as a diode, permits a field effect control of the reverse current.

The many operating possibilities of the structure corresponding to the invention render the latter suitable e.g. as a test structure, for example for a quality check on SOS wafers.

Although various minor modifications may be suggested by those versed in the art, it should be understood that I wish to embody within the scope of the patent warranted hereon, all such embodiments as reasonably and properly come within the scope of my contribution to the art.

I claim as my invention:

1. A semiconductor device comprising in combination:
 a substrate; a substantially intrinsic (I) semiconductor layer on the substrate; a first P doped zone and a first N doped zone in the semiconductor layer and separated by a portion of said semiconductor layer which serves as a base zone so as to form a first PIN diode; a second P doped zone and a second N doped zone in the semiconductor layer and separated by at least the portion of said semiconductor layer between the first P and first N doped zones so as to form a second PIN diode and such that a first charge carrier path between the first P and N doped zones crosses through a second charge carrier path between the second P and N doped zones, the first charge carrier path being positioned to influence the second charge carrier path; the first PIN diode being biased by a first external circuit means and the second PIN diode being biased by a second external circuit means, the first and second circuit means being independent of each other in such a fashion that all four zones may have different potentials; and said connecting line between said second doped zones intersecting said connecting line between said first doped zones at right angles.

2. The device of claim 1 wherein the first external circuit means forward biases the first PIN diode and the second external circuit means reverse biases the second PIN diode such that holes and electrons respectively injected by the first P and N doped zones are respectively partially attracted by the second P and N doped zones.

3. A semiconductor device of claim 1 in which the substantially intrinsic base zone is weakly doped.

4. A semiconductor device of claim 1 in which the substrate is an insulator.

5. A semiconductor device of claim 1 in which the substrate is weakly conductive.

6. A semiconductor device as claimed in claim 1, characterized in that the semiconductor layer comprises silicon and the substrate is an insulator comprising sapphire.

7. A semiconductor device as claimed in claim 1, characterized in that the distance between the first P doped zone and the first N doped zone, and the distance between the second P doped zone and the second N doped zone is substantially greater than an average diffusion length of free charge carriers in the base zone.

8. A semiconductor device as claimed in claim 1, characterized in that at least one further pair comprised of a P doped zone and a N doped zone is provided, the connection lines between the P and N doped zones of each pair intersecting the connection line between the first P doped zone and the first N doped zone.

9. A semiconductor device as claimed in claim 1, characterized in that means are provided through which a magnetic field parallel to the surface of the semiconductor layer can be produced in the semiconductor device.

10. A semiconductor device comprising in combination:
 a substrate; a substantially intrinsic (I) semiconductor layer on the substrate; a first P doped zone and a first N doped zone in the semiconductor layer and separated by a portion of said semiconductor layer which serves as a base zone so as to form a first PIN diode; a second P doped zone and a second N doped zone in the semiconductor layer and separated by at least the portion of said semiconductor layer between the first P and first N doped zones so as to form a second PIN diode and such that a first charge carrier path between the first P and N doped zones crosses through a second charge carrier path between the second P and N doped zones, the first charge carrier path being positioned to influence the second charge carrier path; the first PIN diode being biased by a first external circuit means and the second PIN diode being biased by a second external circuit means, the first and second circuit means being independent of each other in such a fashion that all four zones may have different potentials; and the distance between the first P doped zone and the first N doped zone, and the distance between the second P doped zone and the second N doped zone being shorter than or equal to the average diffusion length of free charge carriers in the base zone located between these doped zones.

11. A semiconductor device comprising in combination:

a substrate; a substantially intrinsic (I) semiconductor layer on the substrate; a first P doped zone and a first N doped zone in the semiconductor layer and separated by a portion of said semiconductor layer which serves as a base zone so as to form a first PIN diode; a second P doped zone and a second N doped zone in the semiconductor layer and separated by at least the portion of said semiconductor layer between the first P and first N doped zones so as to form a second PIN diode and such that a first charge carrier path between the first P and N doped zones crosses through a second charge carrier path between the second P and N doped zones, the first charge carrier path being positioned to influence the second charge carrier path; the first PIN diode being biased by a first external circuit means and the second PIN diode being biased by a second external circuit means, the first and second circuit means being independent of each other in such a fashion that all four zones may have different potentials; and the distance between the second P doped zone and the second N doped zone being shorter than an average diffusion length of free charge carriers in the base zone, and the distance between the first P doped zone and the first N doped zone being considerably greater than said average diffusion length.

12. A semiconductor device comprising in combination:

a substrate; a substantially intrinsic (I) semiconductor layer on the substrate; a first P doped zone and a first N doped zone in the semiconductor layer and separated by a portion of said semiconductor layer which serves as a base zone so as to form a first PIN diode; a second P doped zone and a second N doped zone in the semiconductor layer and separated by at least the portion of said semiconductor layer between the first P and first N doped zones so as to form a second PIN diode and such that a first charge carrier path between the first P and N doped zones crosses through a second charge carrier path between the second P and N doped zones, the first charge carrier path being positioned to influence the second charge carrier path; the first PIN diode being biased by a first external circuit means and the second PIN diode being biased by a second external circuit means, the first and second circuit means being independent of each other in such a fashion that all four zones may have different potentials; at least one further pair comprised of a P doped zone and a N doped zone being provided, the connection lines between the P and N doped zones of each pair intersecting the connection line between the first P doped zone and the first N doped zone; and the connection lines between the P and N doped zones of each pair intersecting the connection line between the first P doped zone and first N doped zone at right angles thereto.

13. A semiconductor device comprising in combination:

a substrate; a substantially intrinsic (I) semiconductor layer on the substrate; a first P doped zone and a first N doped zone in the semiconductor layer and separated by a portion of said semiconductor layer which serves as a base zone so as to form a first PIN diode; a second P doped zone and a second N doped zone in the semiconductor layer and separated by at least the portion of said semiconductor layer between the first P and first N doped zones so as to form a second PIN diode and such that a first charge carrier path between the first P and N doped zones crosses through a second charge carrier path between the second P and N doped zones, the first charge carrier path being positioned to influence the second charge carrier path; the first PIN diode being biased by a first external circuit means and the second PIN diode being biased by a second external circuit means, the first and second circuit means being independent of each other in such a fashion that all four zones may have different potentials; and an insulating layer being provided on said semiconductor layer, and on said insulating layer there being arranged a field effect electrode which extends over the base zone.

14. A semiconductor device comprising in combination:

a substrate; a substantially intrinsic (I) semiconductor layer on the substrate; a first P doped zone and a first N doped zone in the semiconductor layer and separated by a portion of said semiconductory layer which serves as a base zone so as to form a first PIN diode; a second P doped zone and a second N doped zone in the semiconductor layer and separated by at least the portion of said semiconductor layer between the first P and first N doped zones so as to form a second PIN diode and such that a first charge carrier path between the first P and N doped zones crosses through a second charge carrier path between the second P and N doped zones, the first charge carrier path being positioned to influence the second charge carrier path; the first PIN diode being biased by a first external circuit means and the second PIN diode being biased by a second external circuit means, the first and second circuit means being independent of each other in such a fashion that all four zones may have different potentials; and an input control signal source means being provided in the first external circuit means and an output load means being connected in the second external circuit means for creating an output signal which is an amplification of an input signal of the input control signal source means.

* * * * *